United States Patent [19]
Brooks

[11] Patent Number: 6,025,567
[45] Date of Patent: Feb. 15, 2000

[54] BINNING WHEEL FOR TESTING AND SORTING CAPACITOR CHIPS

[76] Inventor: David M. Brooks, 5031 Nighthawk Way, Oceanside, Calif. 92056

[21] Appl. No.: 08/967,053

[22] Filed: Nov. 10, 1997

[51] Int. Cl.[7] .................................................. B07C 5/344
[52] U.S. Cl. ......................... 209/574; 209/643; 209/925; 198/689.1
[58] Field of Search .................................... 209/571, 572, 209/573, 574, 643, 925; 198/689.1

[56] References Cited

U.S. PATENT DOCUMENTS

| | | | |
|---|---|---|---|
| 3,750,878 | 8/1973 | Atchley et al. | 209/643 X |
| 4,253,906 | 3/1981 | Boogers | 209/643 X |
| 4,406,373 | 9/1983 | Braden | 209/574 |

FOREIGN PATENT DOCUMENTS

| | | | |
|---|---|---|---|
| 2-193813 | 7/1990 | Japan | 209/643 |
| 2094254 | 9/1982 | United Kingdom | 209/643 |

*Primary Examiner*—Tuan N. Nguyen
*Attorney, Agent, or Firm*—John J. Murphey

[57] ABSTRACT

A machine for continuously testing and sorting large quantities of miniature capacitor chips, where the chips having electrically conductive surfaces on opposite ends thereof, including a thin, endless belt arranged to pass over a plurality of rotatable pulleys, at least one of which contains outwardly extending pulley drive pins spaced thereabout that match up with a like plurality of first apertures formed in the belt for driving the belt at a controlled speed over a continuous path; a plurality of second apertures formed in the belt and spaced uniformly therealong, each aperture surrounded by a flattened elastomeric mask and having a slot formed therethrough from one surface of the belt to the other surface of the belt; a feeder to feed the chips, a tester to test the chips; a computer for temporarily registering the measured electrical properties of a particular chip within a particular mask in which the chip resides in the belt; and, a binning wheel, pivotally mounted on a shaft for receiving the tested chips from the masks in a controlled fashion, locating chip receptacles that are specific to certain different ranges of measured electrical properties, and transferring each chip received from the belt to one of the receptacles in which the chip exhibits measured electrical properties that fall within the range thereof.

20 Claims, 8 Drawing Sheets

BINNING WHEEL FOR TESTING AND SORTING CAPACITOR CHIPS

BACKGROUND OF THE INVENTION

1. Field of the Invention

This invention pertains to the field of miniature chips, such as capacitor chips and resistor chips used in the computer industry. More particularly, this invention pertains to a binning wheel used in machines that subject these chips to a plurality of electrical tests and sort them according to values assigned to them from the tests.

2. Description of the Prior Art

Computers and other electronic appliances continue to grow in importance in our daily lives. They reach all ages and areas of endeavor. Infants are exposed to computers through electronically-based games that teach musical tones and image recognition. Pre-schoolers play games on computers that lay the basis for later learning math, reading and geography. Elementary, Junior High, High School and College students take classes in computer theory, programming and operation. For those who entered the work force before computers became a part of the school curriculum, there are seminars, home-study courses and public television courses that introduce one to computers, computer operation and software operation. Every business in the United States of America uses computers somewhere in its operation.

The continued use of computers in business and education has created a demand for more computer capacity and faster processing times. It seems that each year computers are made with greater performance and memory. Only a few years ago, computer memory was measured in megabytes whereas, today, it is measured in gigabytes. In addition, other electronic devices, such as VCRs, television sets, cameras, camcorders, auto alarms, radios and the like are using more and more computer hardware to expand their capabilities. Competition among various electronic companies has forced computer and computer-accessory manufacturers to design more powerful and more capable circuitry.

At the center of all this activity are devices so small that one could easily miss or overlook them. They are miniature capacitors and like devices, of a general size of 0.040 inches long with a square or rectangular cross-section 0.020 inches on a side, with spaced-apart, flat, end surfaces. Capacitors of this type are constructed of multiple layers of electrically conductive material held apart by minute layers of a ceramic dielectric that are fired to produce a hard device much smaller than a grain of rice. Used by the thousands in computer circuitry, capacitors, called "chips" by those in the trade, are in great demand. There are resistors of the same general size and shape that are included in the generic term "chips". Even more astonishing is the fact that some of these chips are now being made in multiple units, still as small as a grain of rice, that have segregated conductive end surfaces. In computer circuitry, these chips are soldered directly to the computer circuit board on their flat side surface so that soldering connecting wires to the circuit board is eliminated.

For this special soldering technique, the conductive ends of the chips are coated with a silver paste, dried, and later fired at high heat, to cure or set the silver paste. The conductive ends are thereafter soldered to a specially designed copper "flat" or "trace" located on the circuit board. To apply this silver paste (called "terminating"), certain inventions have been made in hand-operated tools with which to position the chips for coating, reference U.S. Pat. Nos. 4,381,321; 4,393,808; 4,395,184; and 4,526,129. More recently, others have invented a machine that continually handles and coats these chips, reference U.S. Pat. No. 5,226,382. But, terminating and curing these chips is only part of the process. Before using them in any circuitry, each chip must be tested to determine if it is of a capacitance value usable in the circuit and if it has sufficient other electrical and physical properties that will allow it to withstand the rigors of electrical operation. Further, each chip must be sorted into groups of specific ranges of these electrical properties so that they can be used most effectively in the electronic circuitry. There are patents for a device for handling these chips in large volume and at high speed and for separating them into isolated containers depending upon their electrical properties, reference U.S. Pat. No. 5,673,799, Ser. No. 08/464,310, filed Jun. 5, 1995, and titled, MACHINE FOR TESTING AND SORTING CAPACITOR CHIPS AND METHOD OF OPERATING SAME.

Because of imperfections in materials and the multi-step nature of the chip-building process, each chip, such as a capacitor chip, winds up with certain "parasitic" qualities, i.e., impedance qualities in addition to capacitance. Each parasitic quality affects and modifies the chip's capacitor characteristics. Accordingly, it is important to determine the nature and value of these parasitic qualities before inserting the chip into the electrical circuit.

The property of a capacitor that limits the flow of alternating current is called its reactance ($X_c$) and is measured in ohms. The term impedance (Z), also measured in ohms, includes the effect of ordinary ohmic resistance as well as reactance.

"Capacitance" is simply the ratio of the charge acquired (Q) to the applied voltage (V) for any given pair of conductors that are near one another. More specifically:

$$\text{Capacitance} = \frac{\text{charge on either plate}}{\text{potential difference}}$$

$$C(\text{farads}) = \frac{Q(\text{coulombs})}{V(\text{volts})}$$

A capacitor has a capacitance of one farad if one coulomb of charge causes a potential difference of one volt. For most computer applications, a chip is measured in microfarads (1 $\mu F=10^{-6}$ F) or picofarads (1 pF=$10^{-12}$ F). The test to measure the capacitance of the chip is called the capacitance (or CAP) test.

An ideal pure reactance dissipates no power; all energy used to charge the capacitor is recovered upon discharge. In the real world, however, there is always some associated resistance that dissipates some power thereby decreasing the amount of energy that can be recovered. A quality factor (Q) is used to describe a capacitors' purity. Q is $2\pi$ times the ratio of energy stored to energy lost (over unit time), and is a unitless number. A Dissipation Factor (or Df) test is used to determine this property of the chip.

A "Flash" test is conducted on the chip for detecting internal flaws which are detrimental to the electrical integrity of the capacitor and cannot be found with normal capacitance and dissipation factor measurements. The most common flaws take the form of irregular voids, cracks or open areas in the dielectric material that separates the conductors, embedded foreign material, thin spots in the dielectric or electrode, and poor contact between the electrodes and the termination paste. To uncover these flaws, the chip is typically subjected to a test voltage of more than twice its rated voltage and held at that voltage for a short period of time, and any loss of voltage thereafter is measured.

The sequence of the "Flash" test is:
a. Part Present Test—verifies the capacitor is present and made good contact with the test probes.
b. Charge—the capacitor is charged with a constant current to the proper stress voltage.
c. Soak—the capacitor is held at this voltage for a short period of time.
d. Test—leakage current through the capacitor is compared against a limit.
e. Discharge—the capacitor is discharged at some constant current rate.
f. Part Present Test—insures the capacitor did not open during previous testing.
g. Check Test—because the capacitor may fail under the stress of the discharge as well as the charge itself, a check test is performed. This test is a repeat of the previous test, only with a reduced voltage (usually the rated voltage).

The insulation resistance (or IR) is a measure of leakage current across the capacitor and is the product of the chip's resistance and capacitance. For example, a 1 $\mu$F capacitor tested at 25 vdc with 1000 M$\Omega$ resistance, has an IR of 1000 $\Omega$-$\mu$F, or a leakage current of 0.025 $\mu$A. This test is usually conducted by charging the capacitor over a long period of time to insure a maximum charge, removing the charging electrodes, monitoring the discharge over a short period of time, and calculating the internal resistance of the chip by its rate of decay.

For efficiency in operation, these tests are usually performed sequentially as follows:
a. Station 1—Both CAP and Df
b. Station 2—Flash
c. Station 3—IR
d. Station 4—Both CAP and Df (redundant)

Also, since the soak time for the true IR test can be several seconds, there is often more than one station for the IR test, sometimes up to 10 charging stations and a single test station. This way, the chip can keep moving along with other chips through the test machine, and still be subject to the IR test, without slowing down the entire testing procedure.

Each of these tests requires physical contact with the conductive ends of the chips. In some tests, the contact is single and only momentary. In other tests, the contact is multiple and/or prolonged. Prior to these required tests, others have invented a machine to conduct tests upon those chips and sort them pursuant to their test results, reference U.S. Pat. No. 4,406,373. This patented machine relies on the process of placing the chips in a planar carrier and arranging the holes in straight files and straight rows. The carrier is first laid flat and loose chips cast over it, and the bank subjected to vibration to urge the chips into the holes. The chip-filled carrier is then raised up and placed on a trolley at an oblique angle, and indexed past a plurality of test probes. The chips rest against, or abut, a conductive layer and the probes are advanced into contact with only one end of the chip, the other end being treated in common with other chips through the conductive layer. Once the row of chips has been tested, the carrier passes into contact with a set of receptacles where the values assigned to a particular chip during testing finds a corresponding receptacle having a range of values into which the chip's value fits, whereupon the chips are blown by compressed air out of their respective holes and into a particular receptacle.

The problem with this machine is that it is a batch process and does not have the capacity to rapidly test and sort the large quantities of capacitor chips needed in today's markets. In addition, the tests that can be conducted with this machine are limited and cannot involve all of the tests now needed on modern chips. The patented machine has been modified to run by robotics; however, it remains a batch process with limited testing, high labor costs, and low output. In this patented machine with its robotic improvements, significant time is lost in loading the planar carrier with chips and transferring them to the machine to begin the testing operation, as well as removing the empty carrier and relocating it to a remote area for reloading with fresh chips. This lost time has become an important factor of late where higher and higher throughput rates are demanded in the industry. Along with these problems is the fact that my previously patented machine cannot perform the plurality of tests in one operation that are currently called for by the industry. This significant handling and inability to perform a plurality of tests adds to the labor and overall manufacturing costs of chips, as well as reducing their production rate.

In addition, the machines of the prior art are not designed to test chips that have a multiplicity of capacitors or resistors built into them. These are call "array" chips or "IPC" chips and have multiple conductive surfaces arranged in side-by-side order on opposite ends of the chip. In order to test each capacitor of the IPC capacitor chips, multiple electrodes must be used while the chip is being moved along a line in the test facility.

SUMMARY OF THE INVENTION

I have now invented a machine that is the subject of this patent application, for the continuous testing and sorting of large volumes of miniature computer chips, including IPC chips. In addition to being continuous in operation, it can perform all the tests heretofore described above and in the sequence which is desired under present standards. The machine is self-loading and the testing and sorting is done continuously without the need for extensive man power. The additional tests provided by this new machine means that subsequent testing is eliminated, handling time is reduced, and the chips are less likely to be contaminated or subject to damage before being soldered to the circuit board. This saving in subsequent testing reduces manufacturing and processing costs and results in a better product.

My invention includes a novel binning wheel in which is formed a plurality of cavities that open into the wheel from its circumferential edge and that are brought into contact with the slots in the masks, indexed to meet each chip held therein, for transfer of the chips from the belt to the wheel. The chips are then held in these cavities by vacuum and subsequently presented to a plurality of successively aligned sorting stations, each station leading to a receptacle for receipt of chips whose tested values fall within the range of values assigned to that receptacle. Upon momentary pausing over a particular sorting station, compressed air, or other means, is employed to move the chip from its position in the cavity into the receptacle for capture.

The belt in which the chips are originally loaded is designed to carry the chips past a series of testing stations where they are momentarily paused while probes advance into contact with the conductive ends of the chips. During these pauses, the capacitance (CAP) test, dissipation (Df) test, flash test, insulation (IR) test and final capacitance test are conducted in sequence.

A controller, including a computer processor, controls the conduct of the tests and assigns the measured values to the chips to aid in determining their ability to be utilized on circuit boards. The controller also logs the location of all chips in the tape and coordinates this location with the values of electrical properties obtained from the tests. This coordination remains until the chip is dislodged from the binning wheel and sent to the appropriate bin.

Accordingly, the main object of this invention is a machine that can test and sort miniature capacitor and/or chips (including multi-circuit IPC chips) on a continuing basis. Other objects of the invention include a machine that performs a plurality of tests in ordered sequence on the chips, one or more at a time, and that thereafter sorts and collects them according with values placed upon them or assigned to them during the tests; a machine that continuously loads, tests, and sorts the miniature chips without interruption; a machine that contacts the miniature chips using probes that come into contact with the conducting surfaces of the chip so that each one is provided with an exclusive circuit to the testing station as opposed to having all the chips grounded to a common conductive plate; a machine that requires less operator attention than those currently employed; a machine that has a higher handling rate and throughput than any machine now in existence; a machine that handles the chips in a more gentle fashion than that of the prior art and, a machine that utilizes less space and fewer parts than other machines performing the same or similar functions.

These and other objects of the invention may be determined by reading the description of the preferred embodiments along with the drawings attached hereto. The scope of protection sought by the inventor may be gleaned from a fair reading of the claims that conclude this specification.

DESCRIPTION OF THE DRAWINGS

FIG. 7 is a close-up view of the binning wheel and associated hardware shown in FIG. 4;

DESCRIPTION OF THE PREFERRED EMBODIMENT

Figure 1:
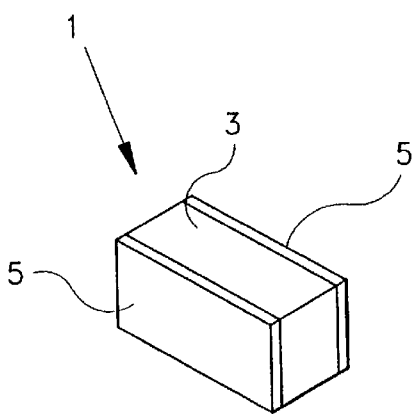
FIG. 1 is an isometric view of a typical chip on which the machine of this invention conducts electrical tests and sorts them into groups of various values.
Figure 2:
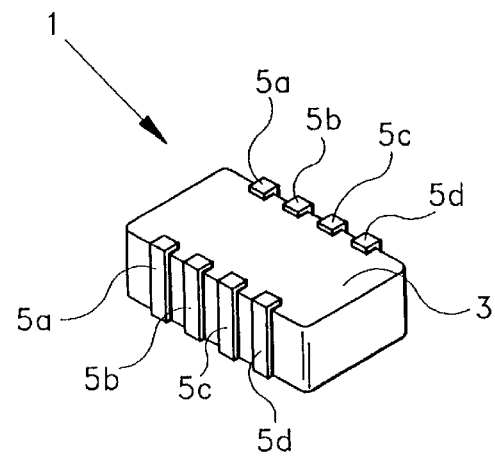
FIG. 2 is an isometric view of a typical IPC chip and shows the multiple use of side-by-side conducting surfaces separating each individual capacitor.

Turning now to the drawings, where like elements are identified with like numerals throughout the 11 figures, FIG. 1 shows a typical capacitor chip 1 that is loaded, tested and sorted by the inventive machine of this invention. Chip 1 is shown to comprise a square or rectangular body 3 having opposed conductive surfaces 5 covered with a thin coating of solderable material such as silver. Chip 1 is shown in FIG. 2 to be of the IPC variety having a plurality of conductive surfaces, 5a, 5b, 5c, and 5d in side-by-side arrangement, each identifying a separate capacitor in chip 1.

Figure 3:
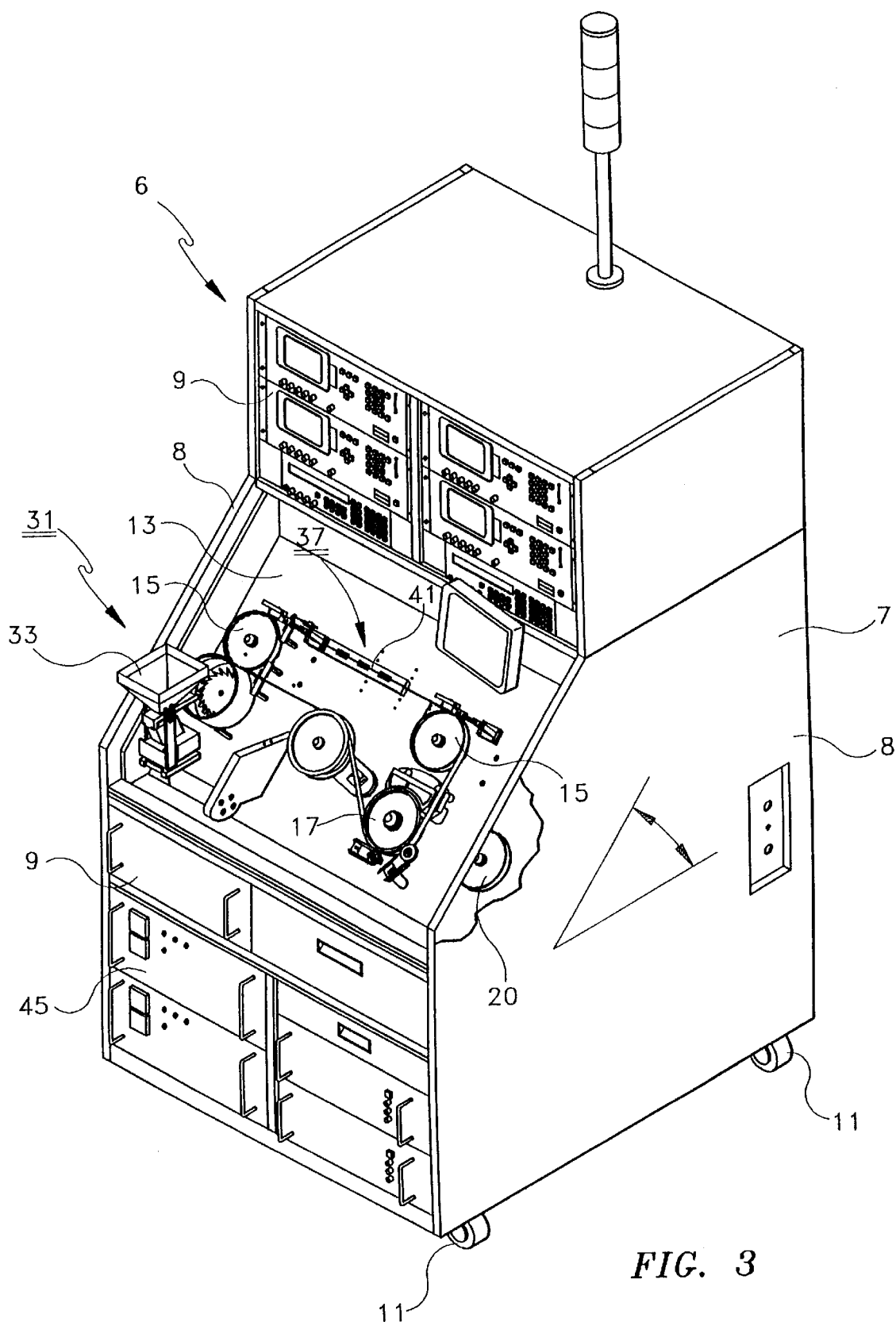
FIG. 3 is an isometric view of the preferred embodiment of this invention.

As shown in FIG. 3, the preferred embodiment of the invention and shows a machine 6 for continuously testing and sorting large quantities of miniature capacitor (and other computer) chips. While this description is limited to capacitor chips, it should not be taken as a limitation in the testing and sorting of other like chips, such as resistor chips, that are used in computer and other electrical circuit boards.

Machine 6 comprises a chassis 7 including a pair of upright side panels 8 held in spaced-apart arrangement by spaced-apart rear (not shown) and front panels 9, said chassis 7 containing controls, motors, testing devices and other components interior thereof that are common to test vehicles of this type. Chassis 7 is set upon a plurality of wheels 11 for moving said machine about.

Figure 4:
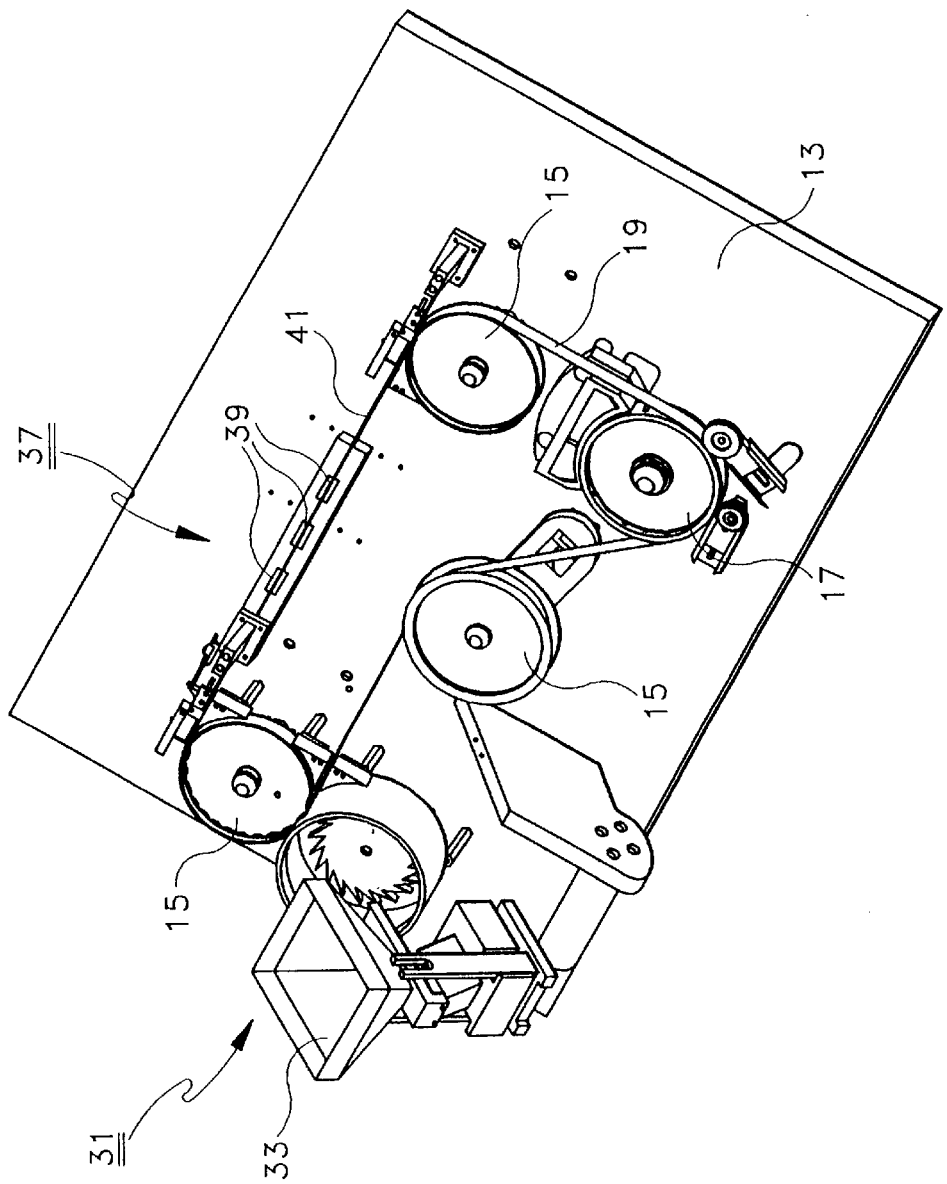
FIG. 4 is an isometric view of the work surface of the embodiment shown in FIG. 3.
Figure 5:
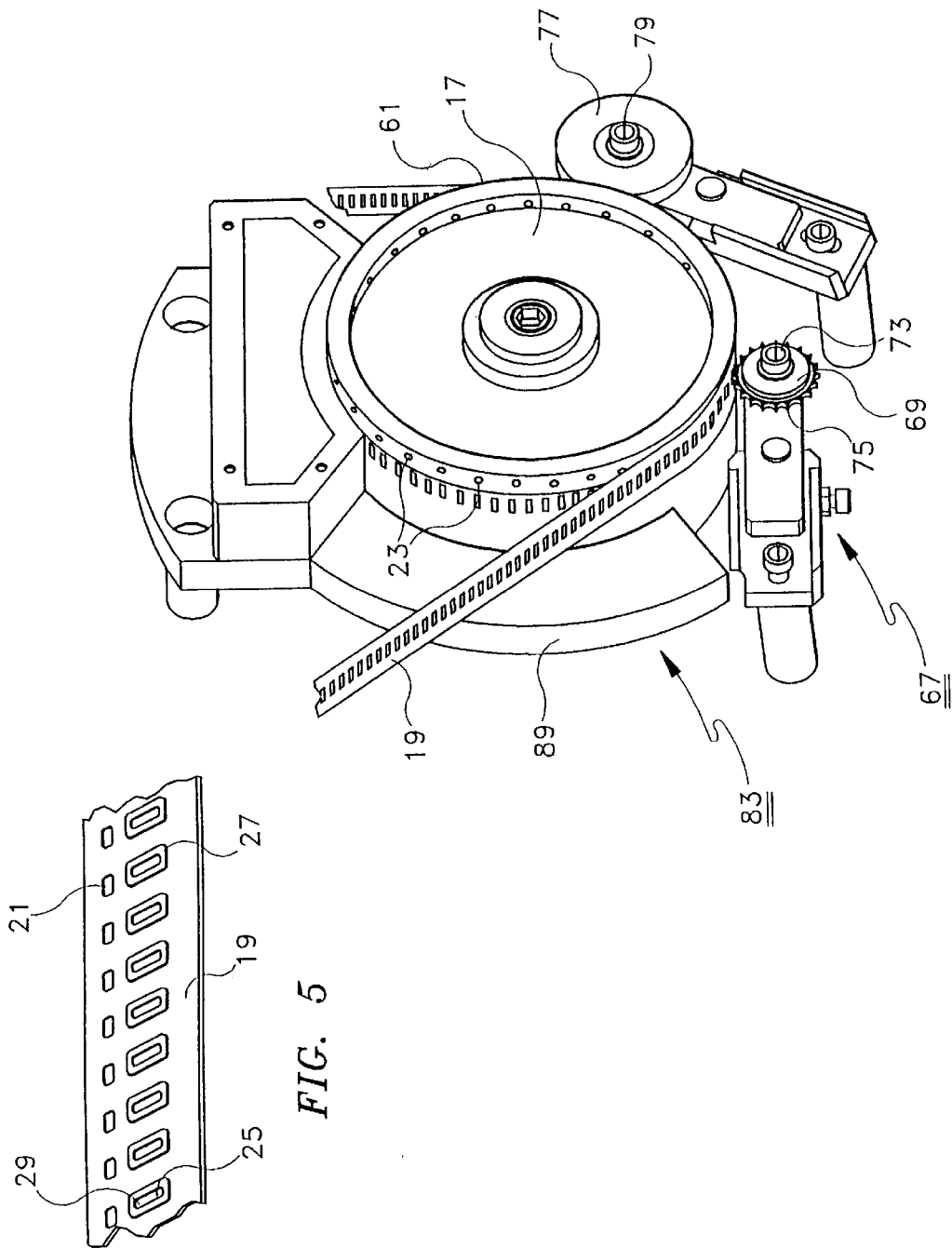
FIG. 5 is a close-up view of the drive belt which is used in this invention.

A work-testing surface 13 is shown in FIGS. 3 and 4 that is provided in front panel 9 and is preferably set at an angle "∝" to the horizontal on which is mounted a plurality of rotatable pulleys 15 and a binning wheel 17. Angle "∝" is normally set at between 25° to 65° from the horizontal and, preferably, set at 450. As shown in FIGS. 3 and 4, over either one of pulleys 15 or binning wheel 17 is placed a thin, narrow endless belt 19, made of stainless steel or like material. As shown in FIG. 5, a row of first apertures 21 is formed in belt 19, preferably located along one edge of belt 19, that matches up with a plurality of drive pins 23 (see FIG. 7) that extend outward from one or more of pulleys 15 or binning wheel 17 to drive belt 19 by a stepper motor 20 or other prime mover located interior of chassis 3 in an endless loop about said work surface 13. A stepper motor is desired because it can be programmed to halt the turning of pulleys 15, and thus belt 19, for any desired period and at any desired location.

As shown in FIG. 5, in belt 19 is also formed a plurality of second apertures 25 spaced uniformly therealong and preferably located in the center of said belt, each aperture 25 surrounded by a flattened elastomeric mask 27 that has a slot 29 formed therethrough from one surface of said belt to the other surface of said belt. Belt 19 is further described in U.S. Pat. No. 5,226,382 which I incorporate herein by reference.

Also shown in FIGS. 3 and 4 is a first means 31 for feeding individual chips 1 from an inventory of loose chips located in a charging bin 33, one at a time, into slots 29 in masks 27, each chip 1 inserted therein in a controlled orientation, i.e., the preferred orientation being that one conductive (terminated) surface (or group of conductive surfaces in the case of an IPC ship) faces directly outward from mask 27 on each side of belt 19. One example of means 31 is set forth in soon-to-be-issued U.S. Pat. No. 5,863,331, Ser. No. 08/792,492, filed Jan. 31, 1997 and titled "IPC (CHIP) TERMINATION MACHINE" (Inventors—Denver Braden and Romulo V. Devera) and said patent is incorporated herein by reference. Other examples of first means 31 include those disclosed and discussed in previously issued U.S. Pat. Nos. 5,226,382 and 5,540,317 and soon-to-beissued patent Ser. Nos. 08/680,719 and 08/464,319. Other such means 31 abound in the prior art.

FIGS. 3 and 4 show a second means 37, spaced-apart from said first means 31, for testing the electrical properties of the chips 1, one at a time, while the chips remain in masks 27 and are moved along with belt 19 about pulleys 15. Second means 37 includes a plurality of electrodes 39 that move into physical and electrical contact with the exposed conductive surfaces of chips 1 as they pass along a rather long span 41 between two pulleys 15 as shown in FIG. 3. Electrodes 39 perform the capacitance (CAP) test, dissipation (Df) test, flash test, insulation (IR) test and final capacitance test on chips 1 previously described in this specification. Another example of electrodes 39 is shown in soon-to-be-issued U.S. patent Ser. No. 08/464,3190 filed Jun. 5, 1995 and titled, "MACHINE FOR TESTING AND SORTING CAPACITOR CHIPS AND METHOD OF OPERATING SAME", and is incorporated herein by reference. Other such means 37 abound in the prior art.

Figure 6:
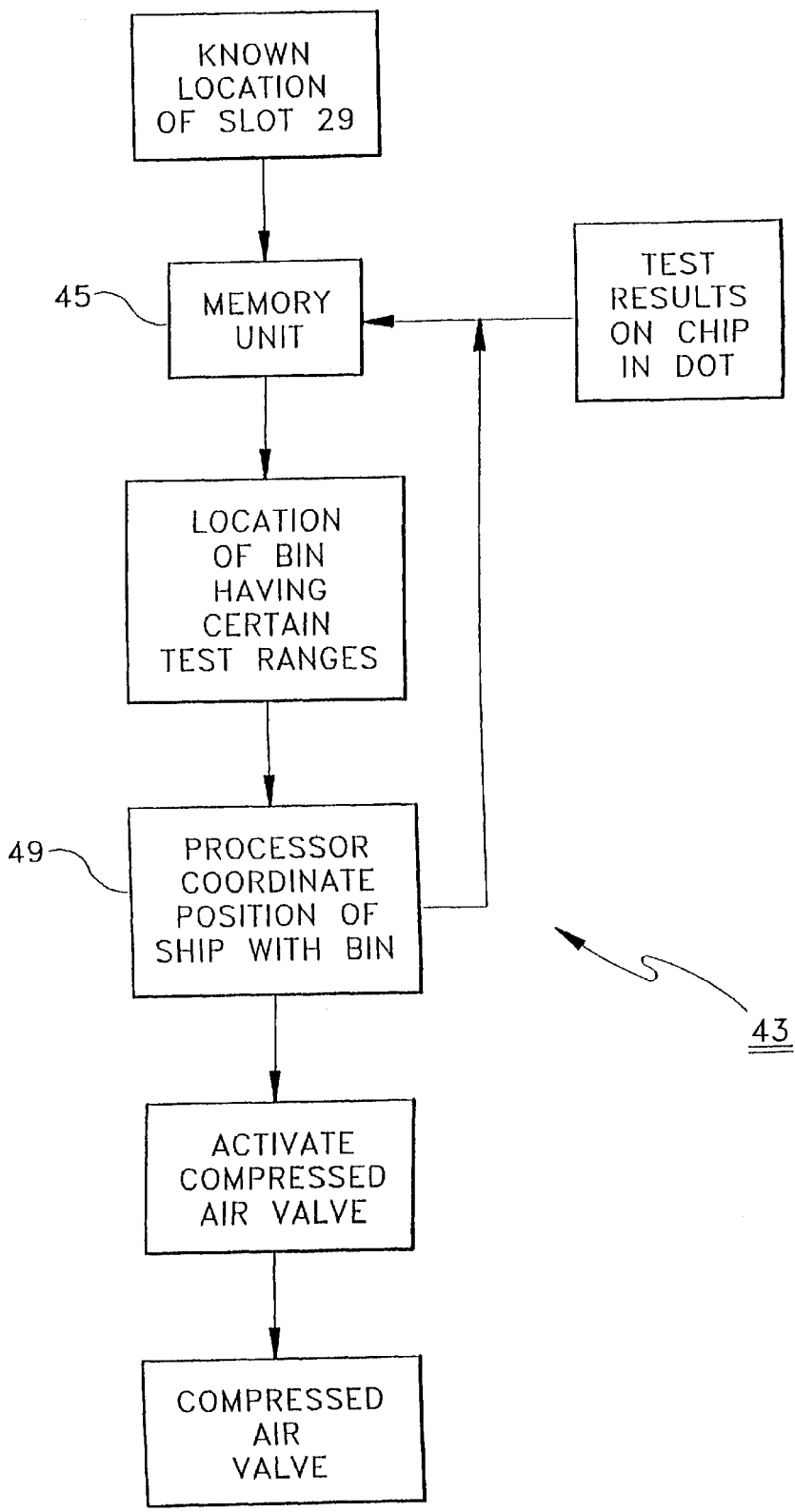
FIG. 6 is a block diagram of the means for coordinating the position of a particular chip in the belt with the values as determined from tests performed on the chip and carrying this coordination through the entire chip testing and handling process.

A third means 43 is shown in FIG. 6, in block diagram, how the measured electrical test results obtained by second means 37 are temporarily registered with the location of each individual chip 1 residing in belt 19. As shown, third means 43 includes a memory module 45 that registers the location of each slot 29 in each mask 27. As the electrical properties of a chip 1 are determined through the use of electrodes 39 and their associated hardware (known in the prior art) this information is transferred by computer processor 49 to memory module 45 to reside therein along with the known location of the tested chip 1.

As generally shown in FIGS. 3 and 4, binning wheel 17, spaced-apart from said first, second and third means 31, 37 and 43, respectively, is pivotally mounted on machine work surface 13 and is established in the closed loop of belt 19 for receiving the tested chips 1 from masks 27 in a controlled fashion. In overall operation, as shown in FIG. 6, the input from memory module 45 and computer processor 49, combine to insure that the test results of each chip 1 are transferred along with chip 1 to wheel 17. Thereafter, the specific chip 1 that has specific measured electrical properties is transferred from binning wheel 17 to one of the receptacles in which the chip exhibits measured electrical properties that fall within the range thereof.

Figure 8:
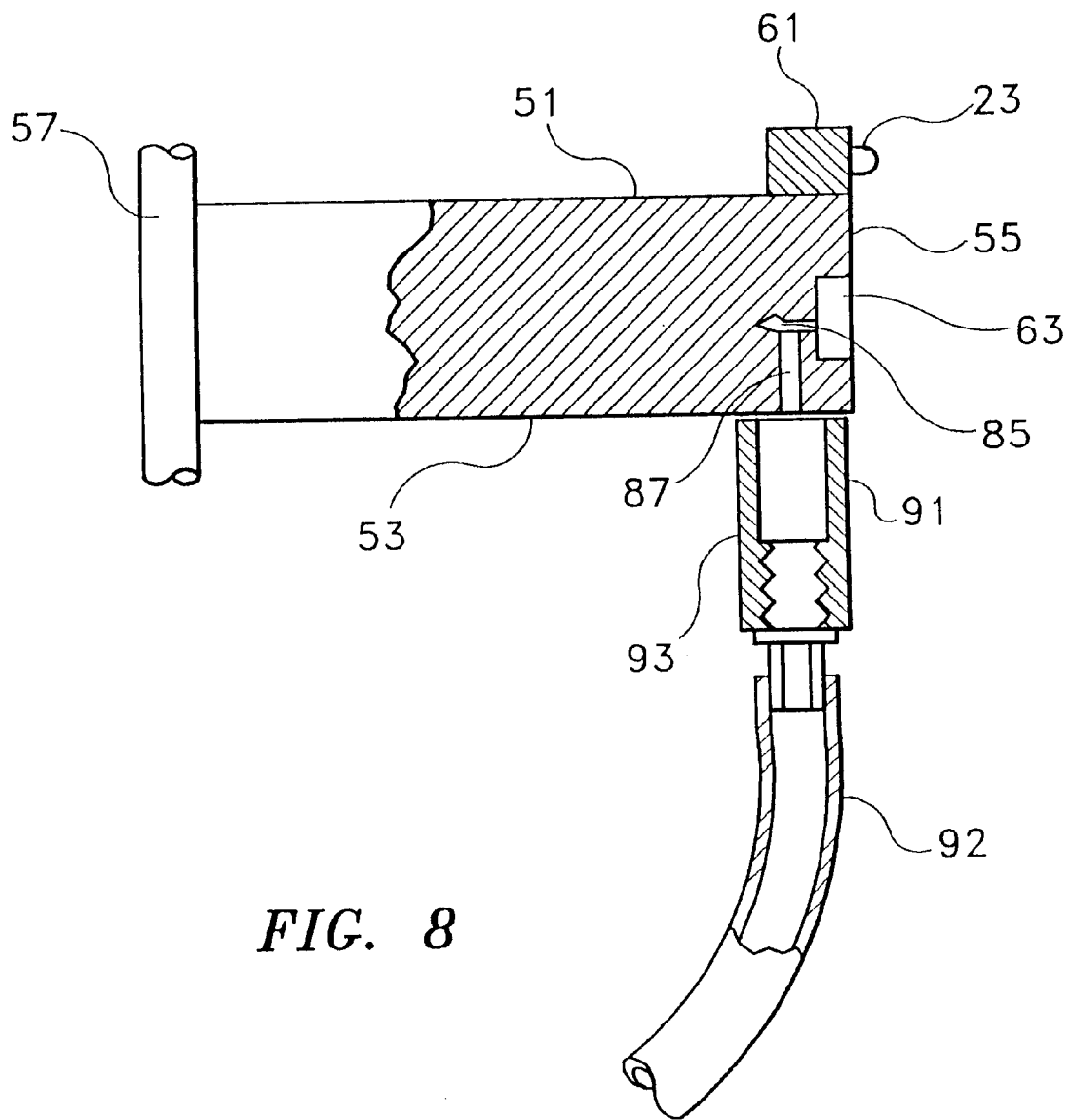
FIG. 8 is side view, partially in section, of the vacuum line emanating from the vacuum manifold and the binning wheel and how the vacuum affects the chip handled in this invention.

More specifically, binning wheel 17 is shown in FIGS. 7 and 8 to comprise upper and lower wheel surfaces, 51 and 53 respectively, said surfaces 51 and 53 arranged in spaced-apart arrangement by a circumferential exterior wheel wall 55, said wheel 17 mounted on a shaft 57 for rotation. Wall 55 provides the outer boundary of wheel 17. A circumferential ring 61 is provided adjacent and exterior to upper wheel surface 51 and contains drive timing pins 23 spaced-apart circumferentially thereabout for receipt in first apertures 21 of belt 19 to clock or index the rotation of wheel 17 with the movement of belt 19.

Figure 9:
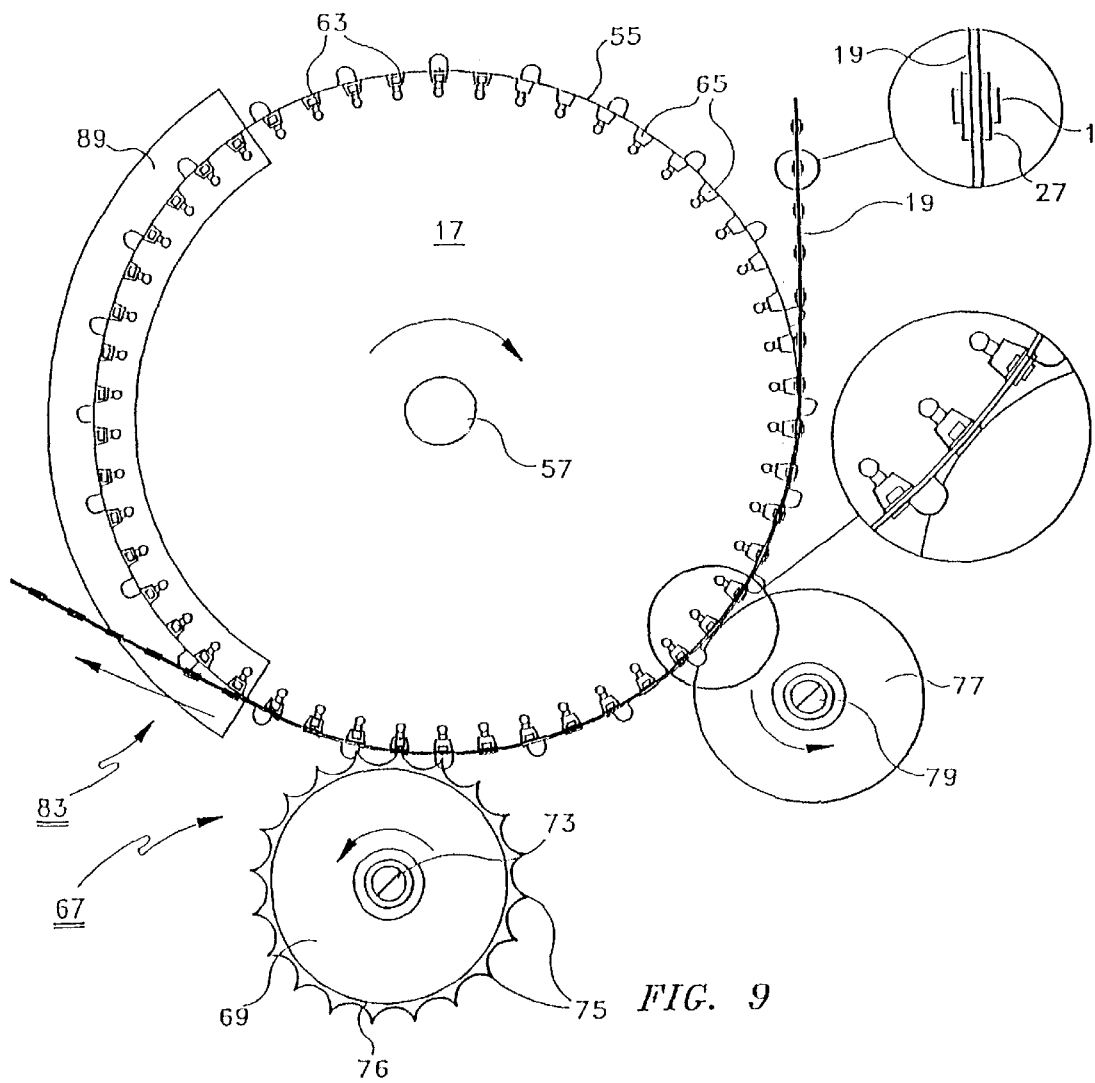
FIG. 9 is a front, close-up view, partially in section, of a portion of the binning wheel showing how the chips are transferred from the belt to the cavities in the wheel; and, FIG. 10 is a side view of the embodiment shown in FIG. 9.
Figure 10:
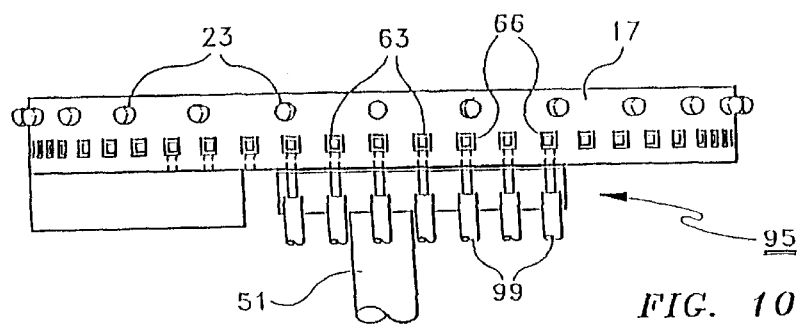

As shown in FIGS. 7–9, a plurality of chip receiving and holding cavities 63 are formed in exterior wall 55 and open through apertures 65 into wheel 17, in spaced-apart arrangement, and are spaced along at intervals that place them in front of each mask slot 29 as belt 19 comes into matched contact with exterior wall 55. Cavities 63 are of a size and shape large enough to receive therein each chip 1 from its respective mask slot 29 and to remain in said cavity until later moved out thereof by other means. Aperture 65, leading into cavity 63 from outside the circumference of wheel 17, may be slightly beveled to provide a slightly wider opening for chip 1 to enter cavity 63 and such a wider opening, in the form of a beveled entryway 66, is shown in FIG. 10.

Chips 1 must be moved from belt 19 to cavities 63 in order to be later sorted and placed in appropriate bins. To transfer chips 1 from belt 19 to cavities 63, a fourth means 67 is provided that, as shown in FIG. 9, comprises a wheel 69 mounted on a shaft 73 for rotation and has a series of outwardly extending teeth 75 formed in its circumferential outer edge 76 and spaced therealong such that, during rotation, each tooth 75 engages a chip 1 in a slot 29 of a mask 27 to push the chip out of the mask and into cavity 63.

Just prior to their transfer into cavities 63, a smooth-edged wheel 77 is provided rotatably mounted on a shaft 79 and placed in tangential contact with the nearest surfaces of masks 27 as they pass by in belt 19. The smooth edge of wheel 77 contacts each of chips 1 in their individual masks 27 and depresses them in slots 29 to the extent that their upper electrically conductive surfaces are moved downward and become level with the upper surface of masks 27. This aids in the later transfer of chips 1 from masks 27 by teeth 75 into cavities 63.

As chips 1 are moved out of mask slots 29 into cavities 63, the slant, "$\propto$", of binning wheel 17 is such that, without a restraint, chips 1 would fall out of cavities 63 by force of gravity. To overcome this problem, a fifth means 83 is provided for holding chips 1 in cavities 63 while binning wheel 17 is turning.

As shown in FIG. 8, fifth means 83 is shown to comprise a plurality of first and second air passageways 85 and 87 respectively, formed in binning wheel 17, each passageway 85 leading from a single cavity 63 inward toward the center of wheel 17 and passageway 87 intersecting passageway 85 and leading downward toward and opening into second wheel surface 53 located under wheel 17. The opening of passageway 87 into second wheel surface is preferably in a circular path in lower wheel surface 53 so that each opening passes over a single spot in surface 53 as wheel 17 turns about shaft 57.

A vacuum manifold 89 is shown in FIGS. 7 and 9 located adjacent and preferably below binning wheel 17, and has third apertures 91 that are located at the lowest end or terminate second passageway 87. The vacuum is applied through a vacuum line 92 and terminal fitting 93 that is moved into in close communication with passageways 87 as said passageways pass across vacuum manifold 89 while wheel 17 is in motion. While the vacuum is applied through manifold 89 into each cavity 63, via lines 92, fitting 93, and passageways 87 and 85, chips 1 are held in cavities 63 while wheel turns about shaft 57.

As shown in FIG. 9, vacuum manifold 89 begins where belt 19 leaves tangential contact with circumferential exterior wall 55 of binning wheel 17. The vacuum remains while cavities 63 in wheel 17 rotate (upward) toward the 12:00 o'clock position. In observing binning wheel 17 face-on in FIG. 9, one can note that belt 19 passes into contact with wheel 17 in about the 3:00 o'clock position and leaves contact with wheel 17 at about the 7:00 o'clock position. Chips 1 are moved slightly in belt 19 by smooth edge wheel 77 at about the 4:00 to 5:00 o'clock position yet remain in belt 19. Chips 1 are then pushed out of belt 19 at about the 6:30 to 7:00 o'clock position by wheel teeth 75 on wheel 69 and are initially held in cavities 63 by belt 19. Vacuum is then applied at about the 7:00 o'clock position and remains in effect until about the 11:00 o'clock position whereupon it is stopped by having cavities pass out of contact with vacuum manifold 89.

Figure 11:
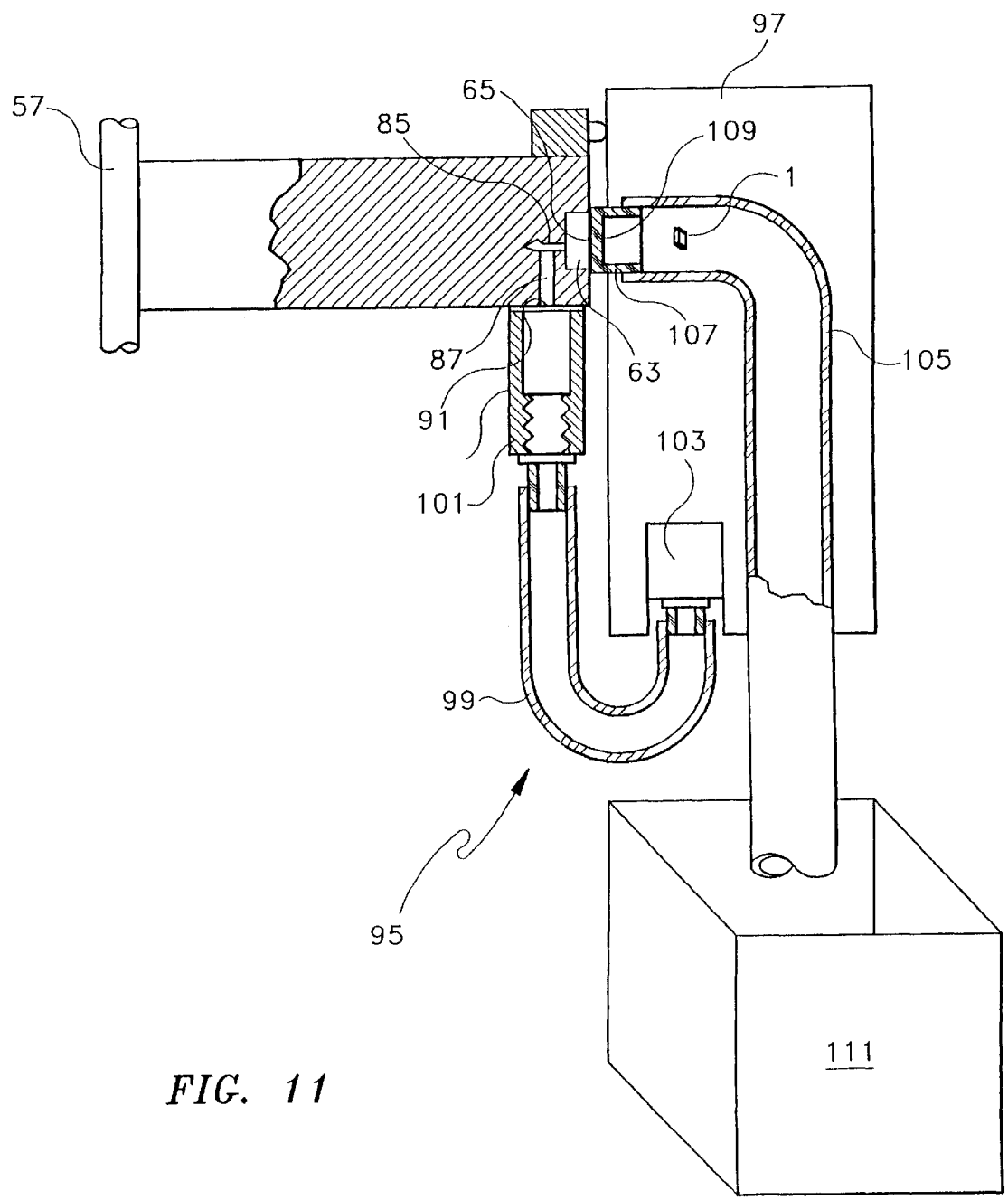
FIG. 11 is an illustrative view of a portion of the compressed air manifold and associated lines and fittings used for blowing the chip from the cavity in the binning wheel to the appropriate bin.

As shown in FIGS. 10 and 11, a sixth means 95 is provided and is shown to comprise a compressed air manifold 97 including a plurality of air lines 99, passing from manifold 97 to fittings 101 set in a row very close to third apertures 91, while wheel 17 turns, and further including at least one, but preferably a plurality of valves 103 set in each line 99 for controlling the flow of compressed air in lines 99. A chip take-off line 105 is connected to a fitting 107 that has an entrance aperture 109 set very close to aperture 65 leading from cavity 63 and passes to one of a plurality of bins 111 that are arranged in order of certain electrical properties of the tested chips. As binning wheel 17 rotates past a particular chip take-off line 105, that leads to a particular bin 111, computer processor 49 causes valve 103 to momentarily open and allow a burst of compressed air to flow through line 99, through fitting 101 into passageways 87 and 85 into cavity 63 and eject chip 1 from cavity 63 through apertures 65 and 109 into line 105 and transport it to bin 111. Using stepper motor 20, as previously described, allows each cavity 63 to pause momentarily over a particular take-off line 105 to allow valve 103 to momentarily open and allow the burst of compressed air to eject chip 1 from the particular cavity.

While the invention has been described with reference to a particular embodiment thereof, those skilled in the art will be able to make various modifications to the described embodiment of the invention without departing from the true spirit and scope thereof. It is intended that all combinations of elements and steps which perform substantially the same function in substantially the same way to achieve substantially the same results are within the scope of this invention.

What is claimed is:

1. A machine for continuously testing and sorting large quantities of miniature capacitor chips, said chips having electrically conductive surfaces on opposite ends thereof, comprising:

a) a thin, endless belt arranged to pass over a plurality of rotatable pulleys, at least one of which contains outwardly extending pulley drive pins spaced thereabout that match up with a like plurality of first apertures formed in said belt for driving said belt at a controlled speed over a continuous path;

b) a plurality of second apertures formed in said belt and spaced uniformly therealong, each aperture surrounded by a flattened elastomeric mask and having a slot formed therethrough from one surface of said belt to the other surface of said belt;

c) first means for feeding individual chips, one at a time, from an inventory of loose chips into said masks in said belt, in a controlled orientation;

d) second means for testing the electrical properties of the chips while the chips remain in the masks and are moved along with said belt, to measure certain electrical properties specific thereto;

e) third means for temporarily registering the measured electrical properties of a particular chip with the particular mask in which the chip resides in said belt; and, f) a binning wheel, spaced-apart from said first and second means, pivotally mounted on a shaft in said machine for receiving the tested chips from said masks in a controlled fashion, locating chip bins, spaced apart from said wheel, that are specific to certain different ranges of measured electrical properties, and transferring each chip received from said belt to one of the bins in which the chip exhibits measured electrical properties that fall within the range thereof.

2. The machine of claim 1 wherein said endless belt is made of stainless steel.

3. The machine of claim 1 wherein said rotatable pulleys and said belt are mounted on a work surface that is slanted with respect to the horizontal.

4. The machine of claim 1 wherein said binning wheel comprises:

a) upper and lower wheel surfaces held in spaced-apart arrangement by an outer circumferential boundary wall;

b) a plurality of chip receiving and holding cavities opening from outside said wheel through apertures formed in said wall, in spaced-apart arrangement, and spaced from said pulley drive pins to match up with said slots in said belt;

c) fourth means for moving chips from said belt into said chip cavities, one chip to a cavity; and, e) fifth means for temporarily holding said chips in said cavities while said binning wheel is turning.

5. The machine of claim 4 further including a beveled wall portion, formed in said boundary wall and about said entrance aperture, to aid the chip in moving from said mask into said cavity.

6. The machine of claim 4 wherein said fourth means comprises a wheel mounted on a shaft for rotation thereabout, said wheel defined by an outer circumferential terminal edge, and a series of teeth extending outwardly about said terminal edge and spaced therealong such that, during rotation, each said tooth engages a chip in one of said slots in said mask to push the chip out of said mask and into said cavity.

7. The machine of claim 6 further including a smooth-edged wheel, rotatably mounted on a shaft, said wheel placed in tangential contact with the nearest surfaces of said masks as they pass by in said belt wherein said smooth edge of said wheel contacts each of the chips in their individual masks and depresses them in said slots to the extent that one of their conductive end surfaces become level with the upper surface of said masks.

8. The machine of claim 4 wherein said fifth means comprises:

a) a plurality of air passageways formed interior said binning wheel, one said passageway leading from a single cavity through said wheel to terminate at one of said wheel surfaces in apertures spaced therealong; and, b) a vacuum manifold located adjacent said binning wheel and arranged to apply vacuum to said passageways and said cavities during part of the rotation of said binning wheel to hold the chips in said cavities.

9. The machine of claim 8 wherein said apertures are arranged in a circular path on said lower surface of said binning wheel to be fed vacuum from one line during turning of said binning wheel.

10. A machine for continuously testing and sorting large quantities of miniature computer chips, said chips having electrically conductive surfaces on opposite ends thereof, comprising:

a) a thin, endless belt arranged to pass over a plurality of motor-driven rotatable pulleys, at least one of which contains outwardly extending pulley drive pins spaced thereabout that match up with a like plurality of first apertures formed in said belt along one side thereof for driving said belt at a controlled speed throughout a continuous loop;

b) a plurality of second apertures formed in said belt and spaced uniformly therealong, near the center thereof, each said aperture surrounded by a flattened elastomeric mask and having a slot formed through said mask from one surface of said belt to the other surface of said belt for holding a chip therein;

c) first means for feeding individual chips, one at a time, from an inventory of loose chips into said masks in said belt, in a controlled orientation such that the two conducting surfaces of the chips extend out from the surfaces of said belt;

d) second means, spaced-apart from said first means, for testing the electrical properties of the chips, one at a time, while the chips remain in the masks and are moved along with said belt, to measure certain electrical properties specific thereto;

e) third means for temporarily registering and retaining the measured electrical properties of a particular chip with the location of the particular mask in which the chip resides in said belt; and, f) a binning wheel, having top and bottom exterior surfaces, spaced-apart from said first and second means, pivotally mounted on a shaft in said machine for receiving the tested chips from said masks in a controlled fashion, and transferring each chip received from said belt to one of the bins.

11. The machine of claim 10 wherein said machine includes a chassis comprising:
   a) a pair of upright side panels 5 held in spaced-apart arrangement by spaced-apart rear and front panels;
   b) a plurality of wheels under said panels for moving said machine about; and,
   c) a work-testing surface in said front panel.

12. The machine of claim 10 wherein said work-testing surface is set at an angle to the horizontal.

13. The machine of claim 12 wherein said angle is preferably set at an angle " " of between about 25° to about 65° from the horizontal.

14. The machine of claim 12 wherein said angle is set at 45°.

15. The machine of claim 10 further including:
   a) a fifth means that comprises:
      i) a plurality of first air passageways formed in said binning wheel, one said passageway leading from a single said cavity through said wheel to terminate in apertures spaced along the underside exterior of said wheel; and,
      ii) a vacuum manifold located adjacent said binning wheel for applying vacuum to said cavities as said wheel turns through part of its rotation to hold the chips in said cavities; and,
   b) a sixth means that comprises:
      i) a compressed air manifold located adjacent said binning wheel for applying a burst of compressed air to said cavities as said wheel turns through a specific location of its rotation, to eject the chip from a specific said cavity and into a bin that is arranged to receive chips having a preselected range of electrical properties;
      ii) wherein said passageway in said wheel for receipt of vacuum is the same passageway in said wheel for receipt of compressed air.

16. The machine of claim 15 wherein said binning wheel is mounted for rotational movement at an angle to the horizontal and, when observing said binning wheel face-on, said vacuum is applied to said cavities formed in said wheel between about 7:00 o'clock to 11:00 o'clock during rotation of said wheel.

17. The machine of claim 15 wherein said compressed air is applied to said cavities between about 11:00 to 1:00 o'clock during rotation of said wheel.

18. The machine of claim 10 wherein said flow of compressed air passes through at least one valve, said valve being in contact with said third means, for opening when a particular chip in one of said cavities reaches a particular location leading to a particular bin so that said chip will not be moved from said cavity until it reaches the location wherein its transfer will be to a bin holding chips having electrical properties that fall within the range thereof.

19. A machine for continuously testing and sorting large quantities of miniature capacitor chips, said chips having electrically conductive surfaces on opposite ends thereof, comprising:
   a) a thin, endless belt arranged to pass over a plurality of rotatable pulleys driven by a stepper motor that pauses the rotation thereof for a programmable amount of time and at pre-selected positions, at least one pulley containing outwardly extending pulley drive pins spaced thereabout that match up with a like plurality of first apertures formed in said belt for driving said belt at a controlled speed over a continuous loop;
   b) a plurality of second apertures formed in said belt and spaced uniformly therealong, near the centerline of said belt, each aperture surrounded by a flattened elastomeric mask and having a slot formed therethrough from one surface of said belt to the other surface of said belt;
   c) first means for feeding individual chips, one at a time, from an inventory of loose chips into said masks in said belt, in a controlled orientation;
   d) second means, spaced-apart from said first means, for testing the electrical properties of the chips while the chips remain in the masks and are moved along with said belt, to measure certain electrical properties specific thereto;
   e) third means for temporarily registering the measured electrical properties of a particular chip with the particular mask in which the chip resides in said belt; and,
   f) a binning wheel, including upper and lower wheel surfaces held in spaced-apart arrangement by an outer circumferential boundary wall;
   g) a plurality of chip receiving and holding cavities opening from outside said wheel through apertures formed in said boundary wall, in spaced-apart arrangement, and spaced from said pulley drive pins to match up with said slots in said belt;
   h) fourth means comprising a wheel mounted on a shaft for rotation thereabout, said wheel defined by an outer circumferential terminal edge, and a series of teeth extending outwardly about said terminal edge and spaced there-along such that, during rotation, each said tooth engages a chip in one of said slots in said mask to push the chip out of said mask and into said cavity.
   i) a fifth means that comprises:
      i) a plurality of first air passageways formed in said binning wheel, one said passageway leading from a single said cavity through said wheel to terminate in apertures spaced along the underside exterior of said wheel; and,
      ii) a vacuum manifold located adjacent said binning wheel for applying vacuum to said cavities as said wheel turns through part of its rotation to hold the chips in said cavities; and,
   j) a sixth means that comprises:

i) a compressed air manifold located adjacent said binning wheel for applying a burst of compressed air to said cavities as said wheel turns through a specific location of its rotation, to eject the chip from a specific said cavity and into a bin that is arranged to receive chips having a preselected range of electrical properties;

ii) wherein said passageway in said wheel for receipt of vacuum is the same passageway in said wheel for receipt of compressed air.

20. The machine of claim 19 wherein said binning wheel is mounted for rotational movement at an angle to the horizontal and, when observing said binning wheel face-on, said vacuum is applied to said cavities formed in said wheel between about 7:00 o'clock to 11:00 o'clock during rotation of said wheel and wherein said compressed air is applied to said cavities between about 11:00 to 1:00 o'clock during rotation of said wheel.

* * * * *